United States Patent [19]

Lee, Jr.

[11] Patent Number: 5,448,229

[45] Date of Patent: Sep. 5, 1995

[54] METHOD AND APPARATUS FOR COMMUNICATING WITH A METER REGISTER

[75] Inventor: Robert E. Lee, Jr., Dover, N.H.

[73] Assignee: General Electric Company, Schenectady, N.Y.

[21] Appl. No.: 997,490

[22] Filed: Dec. 28, 1992

[51] Int. Cl.⁶ ............... H04B 3/00; H04L 27/00
[52] U.S. Cl. ............... 340/870.02; 340/825.54; 340/310.01; 340/310.02
[58] Field of Search .......... 340/310 A, 310 R, 870.02, 340/870.03, 825.54; 324/157

[56] References Cited

U.S. PATENT DOCUMENTS

| | | | |
|---|---|---|---|
| 3,702,460 | 11/1972 | Blose | 340/150 |
| 4,190,800 | 2/1980 | Kelly, Jr. et al. | 325/37 |
| 4,393,501 | 7/1983 | Kellog et al. | 371/33 |
| 4,465,970 | 8/1984 | DiMassimo et al. | 324/116 |
| 4,491,791 | 1/1985 | Balch et al. | 324/157 |
| 4,491,792 | 1/1985 | Bullock et al. | 324/157 |
| 4,491,793 | 1/1985 | Germer et al. | 324/157 |
| 4,571,692 | 2/1986 | Germer | 364/483 |
| 4,692,761 | 9/1987 | Robinton | 340/825.07 |
| 4,697,182 | 9/1987 | Swanson | 340/870.02 |
| 4,749,992 | 6/1988 | Fitzemeyer et al. | 340/870.02 |
| 5,059,896 | 10/1991 | Germer et al. | 324/142 |
| 5,268,666 | 12/1993 | Michael et al. | 340/310 R |

OTHER PUBLICATIONS

Engineering Presnetation to AEIC/EEI Meter and Service Committees, Apr. 8, 1991 (pp. 1–14).
Engineering Presentation to AEIC/EEI Meter and Service Committees, Sep. 9, 1991 (pp. 1–5).
UCNet System Brochure Sep. 1991.
Utility Context Part B Standard Protocol Tables May 12, 1992 (p. 69, Table 40, 94–97).
Standard Meter Reading Protocol, GEI-52556 Nov. 1991.
Extended Meter Reading Protocol, Dec. 4, 1992.
Optocom-2 Protocol, GEI-52558, Dec. 27, 1991.
Optocom-2 Protocol, Appendix A: UCNet Phase 3, Dec. 9, 1992.
U. S. patent application Serial No. 07/968,959, filed Oct. 30, 1992, Apparatus for Retaining Data in a System for Remotely Reading Meters.
U.S. patent application Serial No. 07/968,958, filed Oct. 30, 1992, Apparatus for Temporarily Interrupting Tou and Load Control Schedules.

*Primary Examiner*—James J. Groody
*Assistant Examiner*—Glenton Burgess
*Attorney, Agent, or Firm*—Bell, Seltzer, Park & Gibson

[57] ABSTRACT

A method and apparatus for writing a command to a communications unit of a meter, effecting the execution of the command, and reading the results of the execution includes an electrical metering device having metering means, register means and communications means. The write, indirect execute, and read operations are all driven from one command provided from the reading device to the communication unit.

17 Claims, 10 Drawing Sheets

METHOD AND APPARATUS FOR COMMUNICATING WITH A METER REGISTER

BACKGROUND OF THE INVENTION

A. Field of the Invention

The present invention is generally related to meters, and more specifically, relates to a method for writing a command to meter register, effecting execution of the command by the register, and then reading the results of the execution.

B. Related Art

Electronic meters comprising energy registers and optical communications ports are well known in the art. Examples of reading/programming apparatus, sometimes referred to herein as a reader, for reading information from and programming operation of electronic meter registers are set forth in U.S. Pat. Nos. 4,393,501, 4,491,791, 4,491,792 and 4,491,793. Examples of electronic registers are set forth in U.S. Pat. Nos. 4,571,692 and 4,465,970. An example of an electronic metering unit which provides energy measures to an electronic register is set forth in U.S. Pat. No. 5,059,896.

In the context of reading/programming an electronic register, specific buffer locations typically are utilized by the reader. Specifically, data is stored in a meter register buffer location, and if specific data is required, the reader must access the specific buffer locations where the data is stored.

If an electric power utility utilizes a variety of meters, the reader utilized to read and program such meters must have a number of different programs stored therein so that proper data can be obtained and the different meter registers can be programmed. That is, the reader must be programmed to access the correct, specific buffers at a variety of differently programmed meters.

It would be desirable to provide at least some reader reading and programming capability without requiring the reader to utilize implementation specific programs.

SUMMARY OF THE INVENTION

The present invention, in one embodiment, is an algorithm which may be utilized in connection with an electronic meter comprising a metering unit, a register unit, an optical port, and a communications unit. An external reading device, such as a handheld reading device or a personal computer, is coupled to the communication board via the optical port.

The present algorithm provides that a write command, an indirect execute command and a read command can be provided to the communication unit, e.g., via the optical port, and the results of the execution can be provided to the reader via the optical port. The write, indirect execute, and read operations are all driven from one command provided from the reading device to the communication unit. Such command is referred to herein sometimes as the invoke command.

The invoke command, in accordance with the present invention, provides that the reading device does not need to know the physical address in the communication unit RAM/EEPROM of any of the tables being read/programmed by the reader device. Therefore, the reading device can read/program the meter register without utilizing an implementation specific program, e.g., without having buffer specific information.

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

The present invention is directed specifically to an algorithm, partially implemented in a meter register forming part of an energy meter and partially implemented in a device (e.g., a handheld computer, a personal computer) configured for reading data from the register. The coupling between the meter register and the reading device, sometimes referred to herein as a reader, may be a well known coupling such as optical, RS-232 or some other media.

The present invention, for example, may be practiced in combination with a meter such as the meter described in U.S. Pat. No. 5,059,896 coupled to an electronic register such as the register described in co-pending U.S. patent application Ser. No. 07/691,252, filed Apr. 25, 1992 or in U.S. Pat. No. 4,465,970, all of which are hereby incorporated, in their entirety, herein by reference.

In addition, the present invention can be utilized in connection with protocols such as the protocols described in the following documents: IS-60 CEBus Volume 4 Node Protocol Draft Standard, Utility Context Part A CAL Definition, CEBus Committee of the Electronics Industries Association (EIA), 2001 Pennslyvania Avenue, N.W., Washington, D.C. 20006; and Optocom-2 Protocol, Appendix A: UCNet Phase3, 1992, Optocom-2 Protocol, Technical Development Reference Guide, GEI-52558, 12/91, which are available from General Electric Company, 130 Main Street, Somersworth, N.H. 03878; all of which are incorporated herein, in their entirety, by reference.

Figure 1:
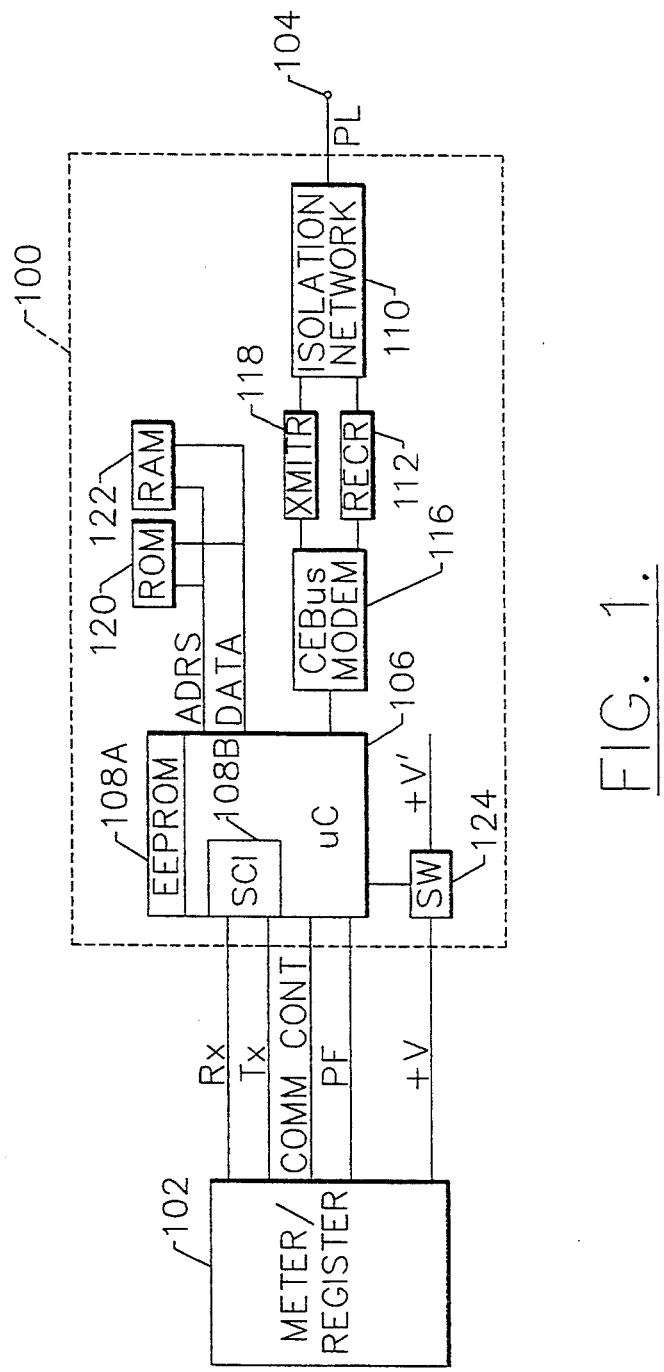
FIG. 1 is a block diagram description of one embodiment of a power line communication circuit.

Referring now to FIG. 1, a block diagram description of one embodiment of a power line communication circuit 100, sometimes referred to herein as a communications unit, coupled between a meter/register 102 and a power line 104. The communication circuit 100, for example, would be physically disposed within the meter enclosure. More particularly, the circuit 100 may be embodied in a printed circuit board disposed within the enclosure of the energy meter. The circuit 100 is shown separate from the meter/register 102 for illustration purposes only. An example of an electronic energy meter in which the circuit 100 may be disposed and coupled to is the meter commonly known as the Phase3 meter which is commercially available from General Electric Company, 130 Main Street, Somersworth, N.H. 03878.

In a first communication mode, the circuit 100 receives information transmitted over the power line 104. The information present on the power line 104 may, for example, be information sent from a communicating device disposed on a utility pole. Such communication device is coupled to the power lines disposed between the secondary side of a distribution transformer and a meter as described in U.S. Pat. Nos. 3,702,460 and 4,749,992 (relay module). The power line 104 may be one of such secondary distribution power lines.

The circuit 100 includes a micro-controller 106 which may be a Motorola 68HC11A1 Micro-controller. The micro-controller 106 includes a EEPROM 108A and a serial communications interface (SCI) 108B. The SCI 108B is utilized for communicating with the meter/register 102 via receive (Rx), transmit (Tx) and communication control (COMM CONT) lines. The circuit 100 also includes an isolation network 110 which couples to the power line 104 and blocks the 50/60 Hz line voltage present on the line 104. A receiver filter 112 serves as a filter/amplifier and removes any undesired signals from the signal output from the isolation network 110. The receiver filter 112 limits the received signal to the 100–400 kHz band and biases the signal for the CEBus modem 116. The modem 116 may be the Intellon SSM10CE spread spectrum power line communication microchip. A transmitter filter 118 operates in the same manner as the receiver filter 112 except that the transmitter filter 118 is for signals to be placed on the power line 104.

The circuit 100 also includes a ROM 120 and a RAM 122 coupled to the micro-controller 106 via address (ADRS) and data (DATA) lines, and a power switch 124. Power for the circuit 100 is provided from a voltage +V' coupled through the switch 124 from a voltage +V provided by the meter/register 102.

Briefly, in operation, data is transmitted and received over the power line 104 in CEBus defined "packets" which may consist of a preamble, a packet body, and a CRC code. When an in-band signal is received, the CEBus modem 116 demodulates the signal and after recognizing the preamble, alerts the micro-controller 106 of an incoming message. When the packet body is received and demodulated, the modem 116 transfers the body as serial data to the micro-controller 106 in 8-bit bytes.

The micro-controller 106, through its programmed operational code stored in the ROM 120, accepts the input request from the modem 116 and performs the requested task. The task could involve assembling data from the RAM 122 or from the meter/register 102. The micro-controller 106 communicates with the meter/register 102 via the SCI 108B which permits asynchronous data interchange. The data is then fed to the modem 116 for transmission through the transmitter filter 118 and isolation network 110 to the power line 104.

The micro-controller 106, through its programmed operational code stored in the ROM 120, alternatively accepts the input request from the reader device via the SCI 108B and performs the requested task. The task could involve assembling data from the RAM 122. The response is transmitted back to the reader through the SCI.

A power fail line (PF) output from the meter/register 102 also is provided to the micro-controller 106. If the meter/register 102 indicates an impending power outage, the micro-controller 116 stops any data transfer on the power line 104, stores all necessary parameters in the internal EEPROM 108A, and then opens the power switch 124. In this manner, data can be saved.

Further details regarding the Motorola 68HC11A1 micro-controller are set forth in the M68HC11 Reference Manual, Revision 3, 1991, available from the Motorola Literature Distribution Center, P.O. Box 20912, Phoenix, Ariz., 20912. Further details regarding the Intellon SSM10CE spread spectrum power line communication microchip are set forth in the Intellon Advance Information: SSC PLCE CEBus Spread Spectrum Power Line Modem available form Intellon Corporation, 5150 West Highway 40, Ocala, Fla., 34482.

Figure 2:
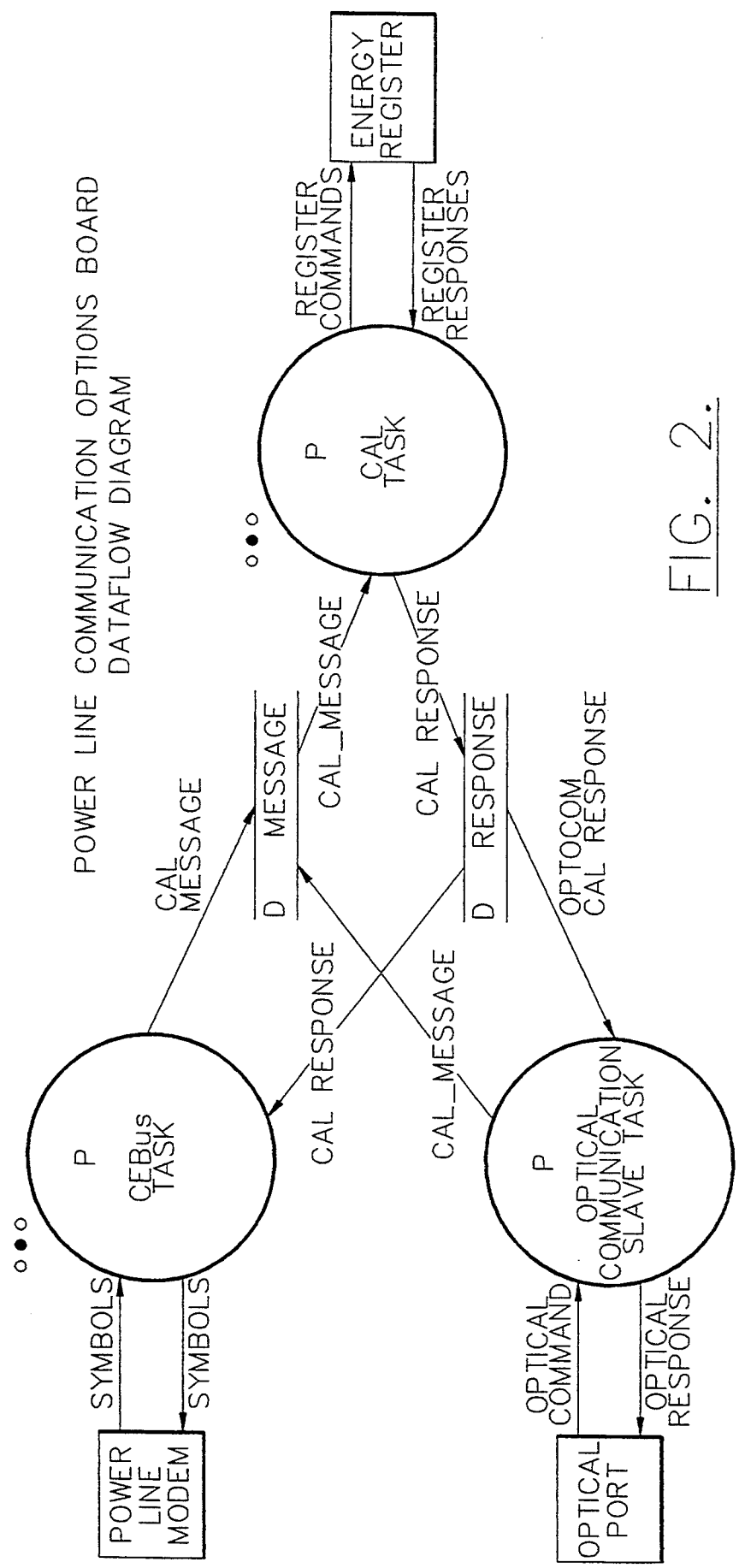
FIG. 2 is a data flow diagram for the power line communication circuit shown in FIG. 1.

Referring now to FIG. 2, a CEBus Task, CAL Task and Optical Communication Slave Task corresponding to processes performed by the processor 106 under the control of task programs stored in the ROM 120 are illustrated. The CEBus Task is associated with the Power Line Modem, the Optical Communication Slave Task is associated with the optical port of the meter, and the CAL Task is associated with the energy register of the meter. The data message/response inputs/outputs for each process are stored in the RAM 122.

In operation, and by way of example, encoded symbols from the power line modem 116 serve as input for the CEBus Task. The CAL Message output by the CEBus Task process is provided as input for the CAL Task process. As illustrated in FIG. 2, Register Commands and Register Responses may be provided from/to the CAL Task process.

In operation, and by way of another example, asynchronous ASCII characters from the SCI 108B serve as input for the optical communication slave task. The CAL message output by the optical communications slave task is provided as input for the CAL task process.

The CAL Response is output to the RAM 122 and may be communicated externally via an optical communications port through the Optical Communications Slave Task or via the power line modem 116 through the CEBus Task. Further details with respect to the contents of each layer and the purpose for the CAL and CEBus architectures are available from the CEBus Committee of the Electronics Industries Association (EIA), 2001 Pennsylvania Avenue, N.W., Washington, D.C., 20006.

The foregoing data flow diagrams are provided herein primarily for background purposes to facilitate an understanding of one context in which the present invention may be utilized. It is contemplated, of course, that the present invention can be utilized in many other contexts.

Figure 3A:
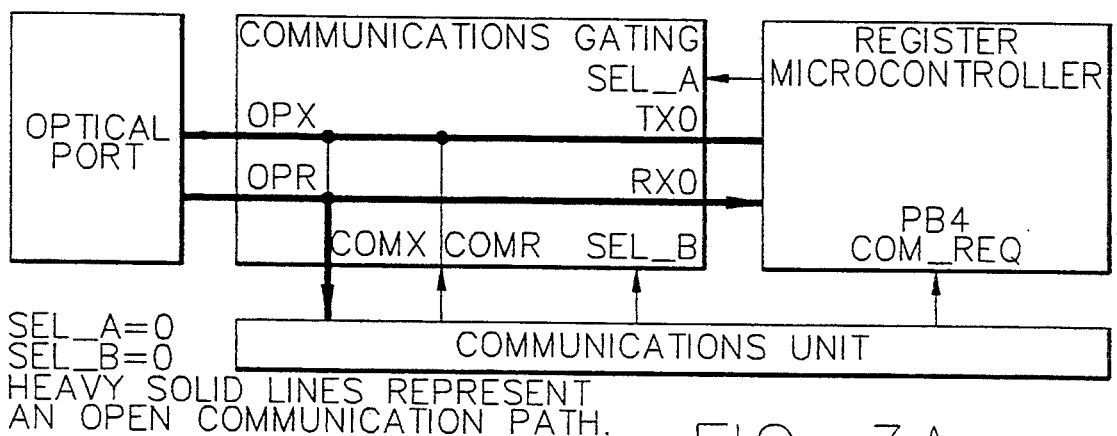
FIGS. 3 A-C are block diagrams illustrating gating logic between a meter register, the communications circuit shown in FIG. 1, and an optical port.

Referring now to FIGS. 3 A–C, the communication path between an optical port, a register microcontroller, an alternate communication port such as the communications unit illustrated in FIGS. 2 and 3, and a communications gating unit are illustrated. More particularly, FIG. 3A illustrates the communication path when the alternate communication port is in the standby mode. More particularly, the alternate port receives signals transmitted through the optical port to the register microcontroller but the alternate port does not detect communication from the register microcontroller to the optical port.

Figure 3B:
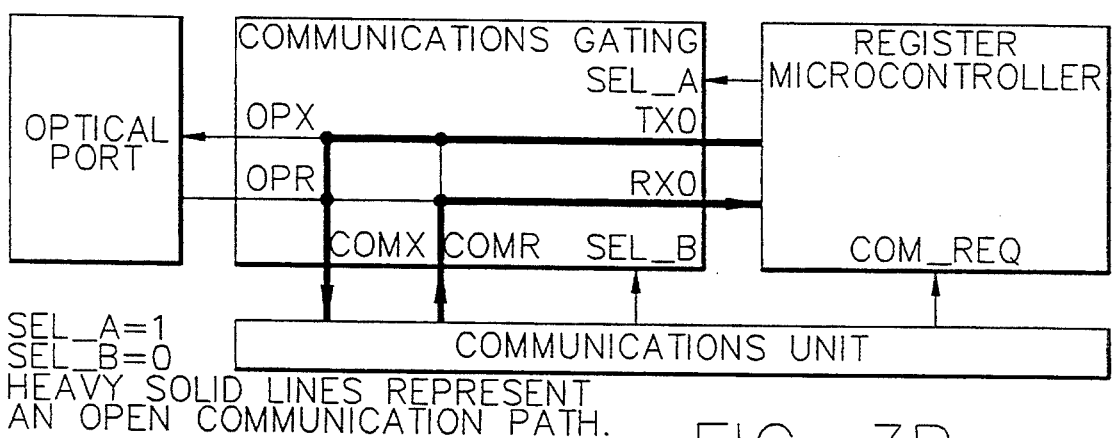
Figure 3C:
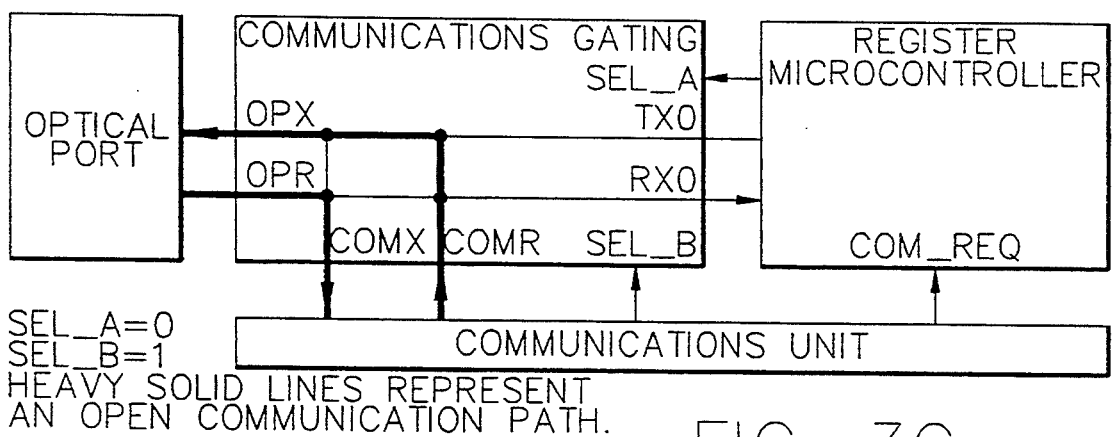

FIG. 3B illustrates the configuration when the alternate communications port is communicating with the register microcontroller. Particularly, no signals are passed to the optical port. FIG. 3C illustrates the configuration when the optical port and the alternate communications port are communicating. In this mode, no communications are passed to the register microcontroller. The configuration illustrated in FIG. 3C is the configuration in which the present invention is practiced.

FIGS. 4 and 5 illustrate operation of a reader device and a meter register in the context of the Optocom - 2 Protocol. The present invention, however, has utility in contexts other than the Optocom - 2 Protocol and the specific description with respect to the Optocom - 2 Protocol should not be construed as a limitation of the present invention. The algorithms illustrated in FIGS. 4 and 5 are interactive and depend on inputs/outputs being transmitted from one to the other.

Referring now in detail to FIGS. 4 A-G, an algorithm to be executed by a reader device, sometimes referred to herein as a reader, such as the reader device available from MicroPalm Computers, Inc., 13773-500 ICOT Boulevard, Clearwater, Fla. 34620 is illustrated. The reader device, for example, would be coupled to an optical coupler, such as the SmartCoupler - 2 device, which includes an optical probe. In addition to providing optical coupling, the SmartCoupler - 2 device may perform protocol conversion so that commands and data transmitted between the reader and the meter register are properly formatted. The SmartCoupler - 2 device is commercially available from General Electric Company, 130 Main Street, Somersworth, N.H. 03878.

More particularly, the optical port is configured to mate with the SmartCoupler device. Both the port and the SmartCoupler have optical transmitting and receiving elements disposed therein. The communications unit receives signals transmitted to the optical port by the reader device via the SmartCoupler. The communications unit also transmits information to the reader device through the optical port and to the reader device via the SmartCoupler. In this context, the reader device is the master and the communications unit is considered the slave. The communications unit only responds to commands from the reader device. If security is desired, of course, a sign-on security code could be required to initiate operations.

Input to the communications unit in the present context is a four byte array with subscripts from 1-4 containing the command and a 256 byte array containing the message to transmit. The format of the command and message are described below. The invoke command is designated by a 42h. The length specifies the length of the message to follow: 0=256, 1-255. The two unused bytes should be set to 00h. The checksum is calculated by adding together bytes 1-4 (dropping any carries) and taking the two's complement of the value. When bytes 1-4 are added with the checksum, the result should be zero. The format is illustrated below.

| Invoke 42h | Length | Unused | Unused | Checksum | Message | Checksum |
|---|---|---|---|---|---|---|

Output provided from the communications unit to the reader device is the status of the command and optionally, the length of the response and a 256 byte array containing the response. The output format is illustrated below.

| OK | OK | OK | Length | Response | Checksum |
|---|---|---|---|---|---|

Figure 4A:
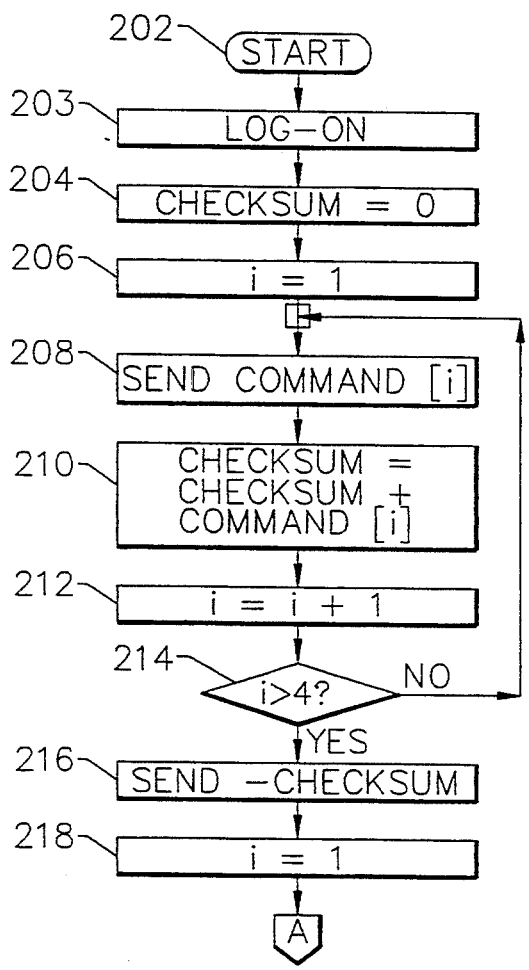
FIGS. 4 A-G are a flow chart illustrating one embodiment of a sequence of process steps to be executed, in accordance with the present invention, by a reading device.

Referring now in detail to FIG. 4A, the algorithm to be executed by the reader device begins at start legend (202). The user then logs-on (203) to the meter by coupling to the meter optical port and transmitting a proper security code. A more detailed description of security codes is provided in co-pending U.S. patent application Ser. No. (07/998,064), filed concurrently herewith.

The checksum register of the reader is initialized to zero (204), and then a variable i, used to index through the command array, is initialized to 1 (206). The first element of the reader command array, command [1], is transmitted (208) by writing command [i] to the Universal Asynchronous Receiver Transmitter (UART) buffer in the reader. Before the byte is written to the UART buffer, the UART should be checked to ensure that the previous byte as been transmitted. There may be a need to delay so that the previous byte is transmitted.

The checksum is updated by adding the byte just transmitted, command [i], to the checksum, dropping any carries (210). The index variable i is advanced to the next element in the array. This is done by incrementing i by 1 (212) and then comparing i to 4. If i is less than or equal to 4 (214), there are more bytes in the command to transmit. Steps 208-214 are repeated until all four of the command bytes are transmitted.

Once all of the command bytes have been transmitted, the two's complement of the checksum on the four command bytes is transmitted (216). The two's complement of the checksum is transmitted so that when all of the bytes included in the checksum are added together along with the checksum, the result will be zero if there were no errors in transmission. The index variable i is set to 1 (218) to prepare for transmission of the message.

Figure 4B:
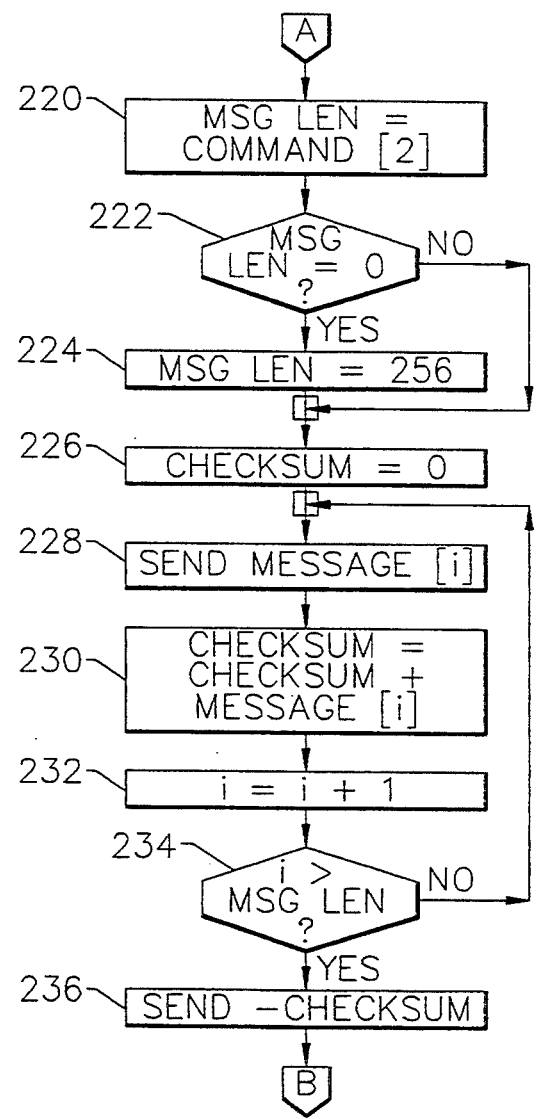

Referring to FIG. 4B, a local variable, msg len, is set to the length of the message found in the second element of the command array, command [2] (220). If the length of the message is equal to zero (222), the actual length of the message is 256 bytes and the msg length is set to 256 (224). Then, the checksum for the message is initialized to zero (226). The first byte of the message, message [1], is transmitted (228). The checksum is updated by adding the current byte, message [i], to the checksum (230), dropping the carry bit. The index variable is then advanced to the next element in the array (232). If there is more message to transmit (234), steps 228-234 are repeated until the entire message is transmitted. The two's complement of the checksum is transmitted next (236).

Figure 4C:
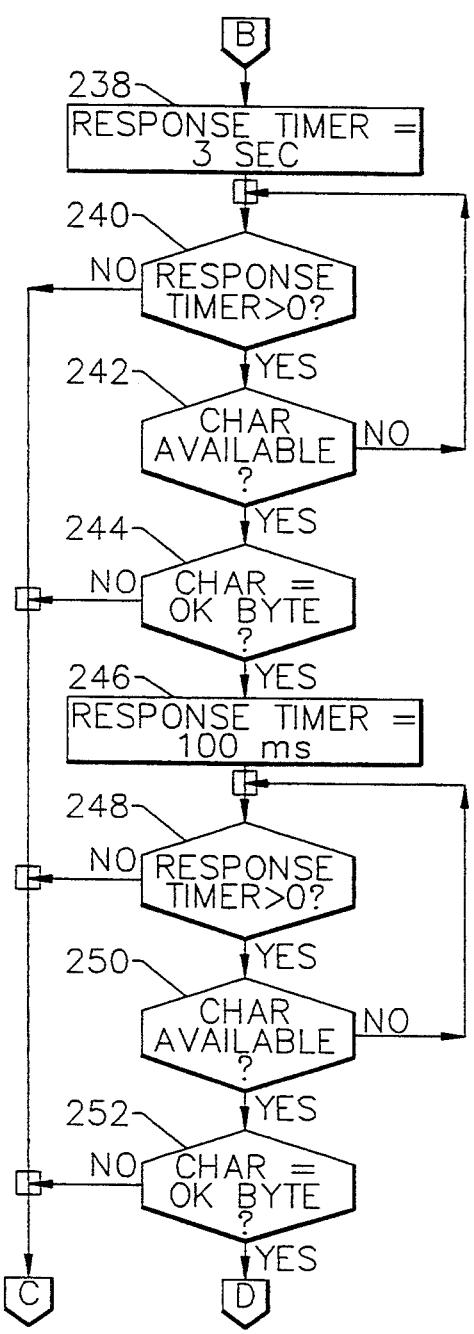

Referring to FIG. 4C, the response timer is set for 3 seconds (238). This indicates the amount of time the reader will wait for a confirmation that the communications unit received the command with the correct checksum. If the response timer is still running (240), the reader will wait for a character to become available (242). The UART is checked for the availability of a character. If a character is available, the character is read from the UART and compared to an OK byte, 4Ch (244). A NAK2, 25h, indicates that there was an error receiving the command. If the character received is an OK byte, the communications unit received the command and it passed checksum. The response timer is set to 100 ms (246) and the reader enters a loop (248-250) to wait for the OK byte for the message. A NAK2 indicates that an error occurred receiving the message. If the next character received is an OK byte (252), the communications unit received the message and checksum correctly.

Figure 4D:
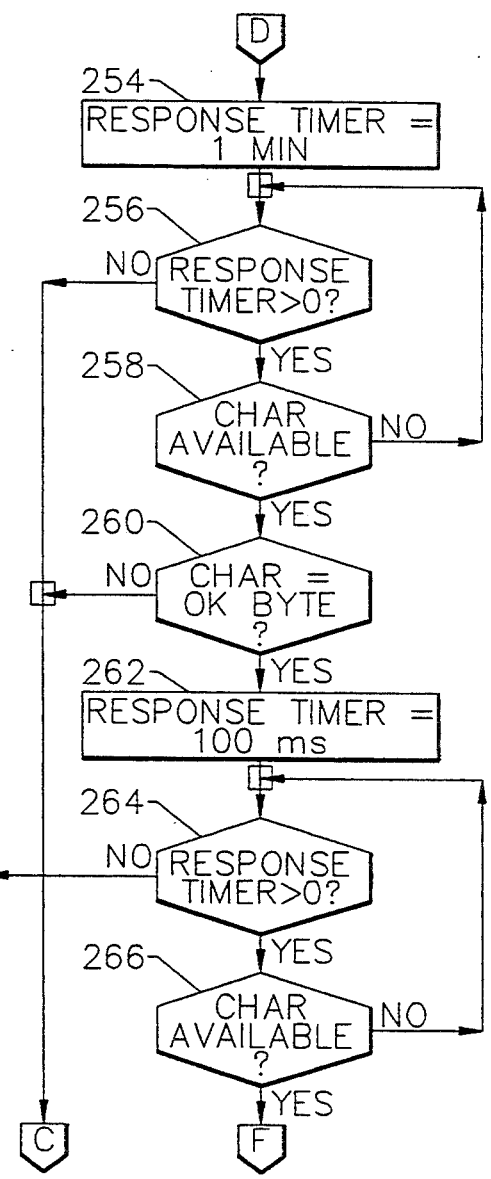

Referring to FIG. 4D, the response timer is set to one minute (254) to allow the communications unit to process the message and formulate a response. The reader enters a loop (256–258) to wait for an OK byte from processing the message. When a byte is received, it is compared to the OK byte (260). A NAK2 indicates that an error occurred while processing the message. Possible causes for the error include, but are not limited to, syntax errors or unsupported commands. If the byte received is an OK byte (260), the communications unit successfully processed the command. If a response is following, the length of the response will be transmitted next and the response timer is set for 100 ms (262), and a loop (264–266) is entered to wait for a byte to be received. If response timer expires (264), this indicates that there is no response to the message. If a character does arrive (266), a response follows.

Figure 4E:
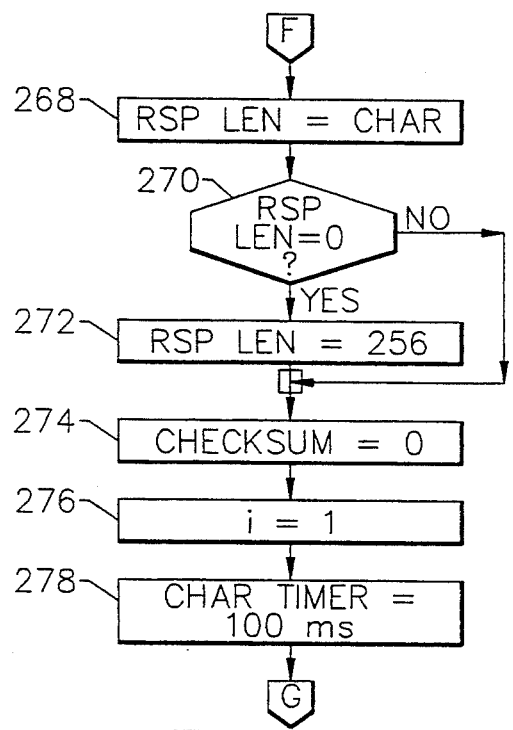

Referring now to FIG. 4E, the character is received and a local variable, rsp len, is set to the length of the response (268). If the length of the response is zero (270), the length of the response is really 256 bytes (272). The checksum for the response is then set to zero (274). The index variable, i, is set to 1 (276), and the char timer is set to 100 ms (278). Each character must be received within 100 ms. If no character is received within 100 ms, the transmission has been interrupted.

Figure 4F:
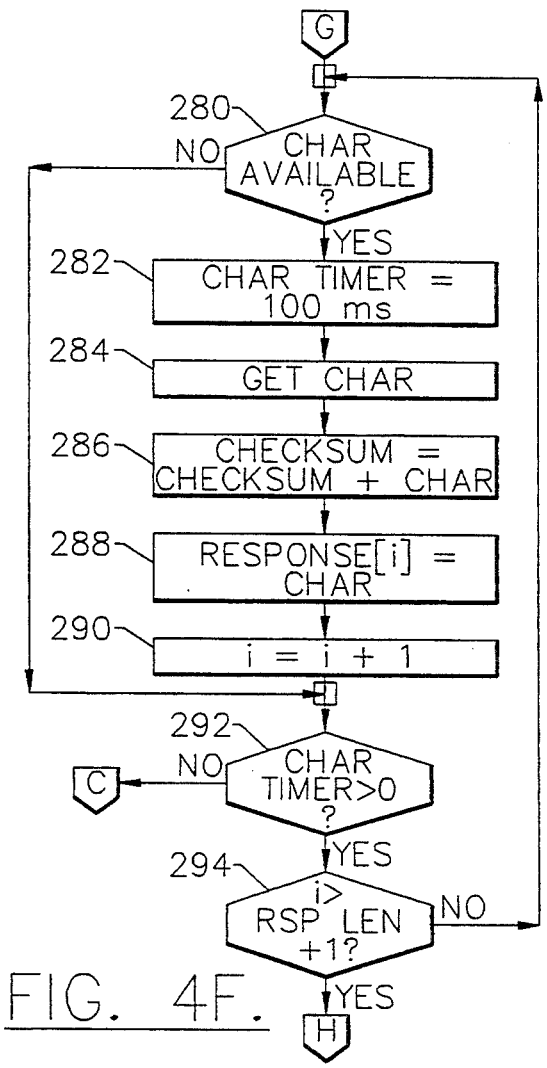

Referring to FIG. 4F, the reader UART (Universal Asynchronous Receiver/Transmitter) is checked to see if a character is available (280). If a character is available, the character timer is set to 100 ms (282) and the character is read from the UART (284). The checksum is updated, adding the value of the character received (286), dropping the carry bit. The character is then stored in the response buffer (288) and the index variable is incremented (290). This loop (280–294) continues until the char timer times out (292) or all of the response, including the checksum, has been received (294).

Figure 4G:
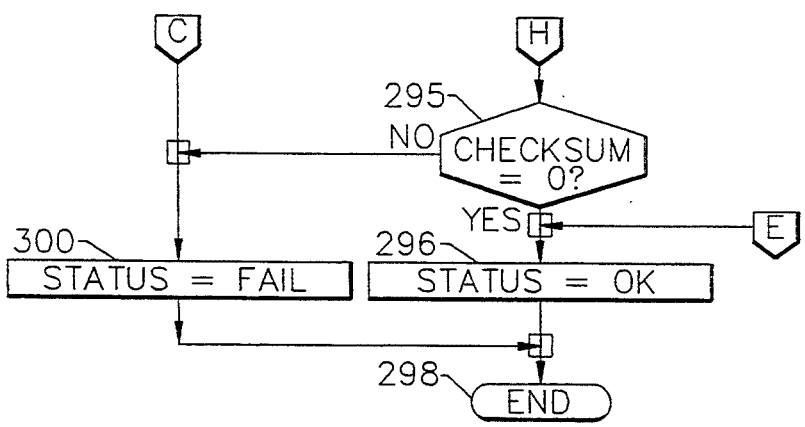

Referring to FIG. 4G, if the entire response was received, including the checksum, the checksum is checked to ensure that it has a value of zero (295). If the value of the checksum is zero, the invoke command completed successfully (296) and the process is complete (298). If an OK byte was not received when expected (244, 252, or 260), the checksum of the response failed (300) or a time out occurred (240, 248, 256 or 292), the invoke command was not completed successfully (300), and the process is complete.

Referring now to operations to be performed by the communications unit, FIGS. 5 A–G describe a sequence of process steps executed by the communication unit upon receipt of an invoke command. Generally, upon receipt of the invoke command, the communications unit processes the command and returns a response if one is available. For control purposes, the reader is considered the master and the communications unit is considered the slave. The communications unit does not initiate the communication. It only responds to the reader. With respect to the algorithm illustrated in FIG. 5, the reader has signed on to the communication unit. A description regarding how to sign on to the communication unit is set forth in co-pending U.S. patent application Ser. No 07/998,064.

For communications between the communications unit and a reader through the optical port, and in general, the communications unit receives data from a reader with the optical port gating in the standby mode (FIG. 3A). Once it is determined that the communications unit is to communicate exclusively with the reader, the communications unit switches the gating so that communications with the register is blocked (FIG. 3C) by setting the SEL_B to 1. The communication unit then transmits and receives characters to and from the reader by utilizing the SCI 108B. A character is transmitted by writing the character to the SCDR Tx buffer. Before the character is written to the SCDR Tx buffer, the SCSR TDRE bit should be checked to ensure that the previous character has been transmitted. The communications unit may need to wait for the TDRE bit to clear. To receive a character from the reader, the communication unit first checks whether a character is available. A character is available if the SCSR RDRF bit is set to 1. If a character is available, the character is received by reading it from the SCDR Rx buffer. When communication is complete, the communication device should switch the optical port gating back to standby mode (FIG. 3A) by setting SEL_B to 0.

Figures 5A, 5B:
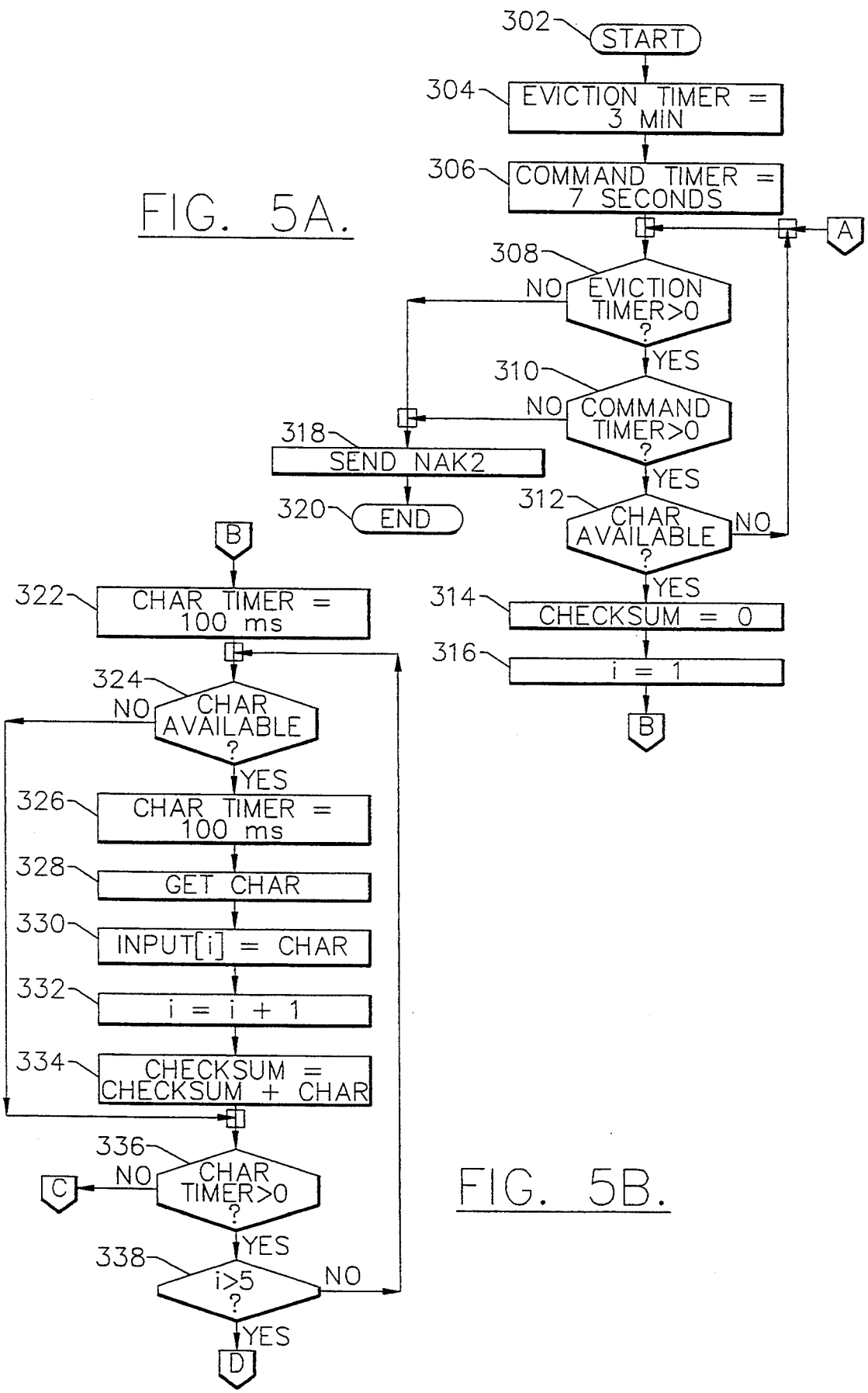
FIGS. 5 A-G are a flow chart illustrating one embodiment of a sequence of process steps to be executed, in accordance with the present invention, by a communication unit forming part of an energy meter.

Referring now more particularly to FIG. 5A, operations begin with start legend (302) and an eviction timer is set to three minutes to limit the length of the communication session (304). The command timer is set to seven seconds (306). If there is no activity on the optical port for seven seconds, the communications session will be terminated. A loop is entered in which the communication unit checks the eviction timer (308) to see if it has expired and the command timer (310) to see if it has expired and looks for the reception of a character (312). If either timer expires, the communication unit sends a NAK2, 25$h$ (318), and the communication session ends (320). If a character arrives at the SCI (312), a local variable for calculating the checksum is initialized to zero (314) and an index variable, i, is set to 1 (316).

Referring to FIG. 5B, the character timer is set to 100 ms (322). If, after the first character in a command is received, the next character is not received within 100 ms, reception of the command is aborted. If a character is available (324), the character timer is reset to 100 ms (326). The character is read from the SCI (328) and stored in the input buffer at the current location of the index variable, input [i], (330). The index variable, i, is incremented to the next element in the input buffer (332) and the checksum is updated by adding the value of the byte received to the checksum, dropping any carries (334). The communication unit enters a loop and repeats steps 324–334 until the inter-character timer expires (336) or the entire command, including the checksum, is received (338).

Figures 5C, 5D:
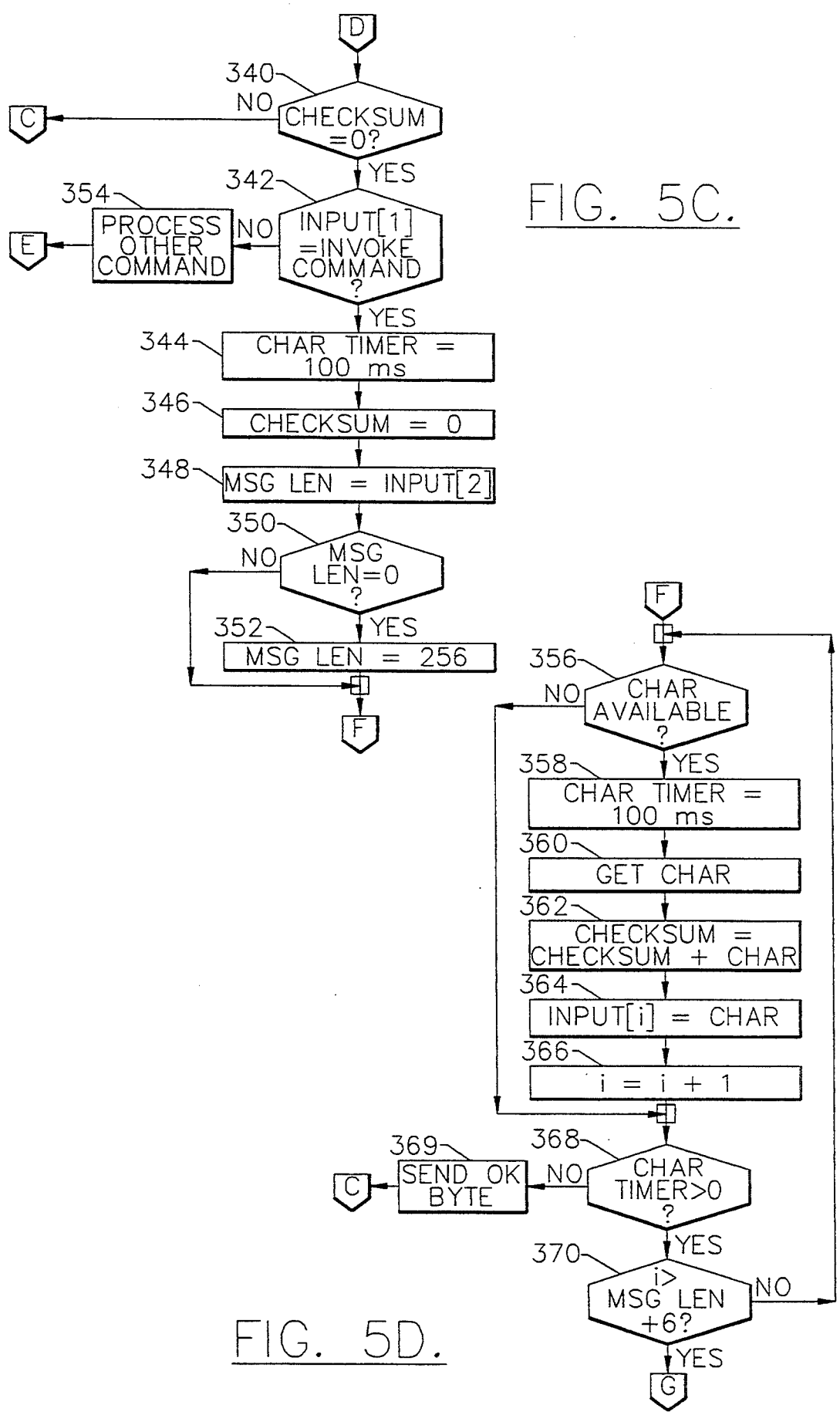

Referring now to FIG. 5C, if the entire command including the checksum was received, the checksum is compared to zero (340). If the command was transmitted successfully, the value of the checksum will be zero. If the command, input[1], is equal to the invoke command, 42$h$ (342), the inter-character timer is set to 100 ms (344), the checksum is reset to zero (346) and the length of the message, msg len, is initialized to the second byte in the command, input [2] (348). If value of msg len is zero (350), msg len is set to 256 (352). If the command, input[1], is not equal to the invoke command, 42$h$ (342), the operations continue with processing the other command (354).

Referring to FIG. 5D, if a character is available (356) the inter-character timer is set to 100 ms (358), the character is read from the SCI (360), the checksum is updated by adding the character received (362), the character is stored in the input buffer (364), and the index variable is incremented to the next element in the input array (366). This loop continues (356-370) until either a character is not received within 100 ms (368) or the entire message plus the checksum byte is received (370). If the inter-character timer expires (368), an OK byte is transmitted (369) to indicate that the command was received correctly.

Figure 5E:
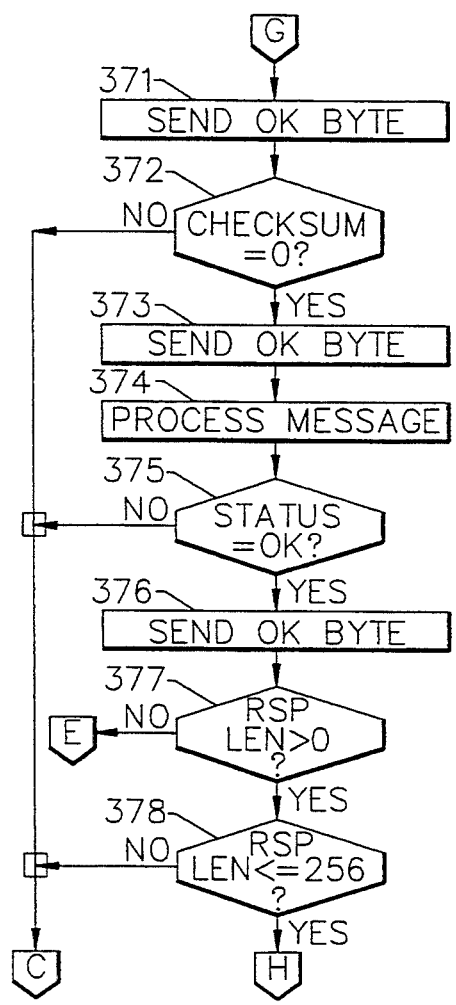

Referring to FIG. 5E, an OK byte is transmitted (371) and the checksum of the message is checked. If the checksum is zero (372), an OK byte is transmitted (373) to indicate that the message was received correctly, and a procedure is called to process the message (374).

In the case of the communication unit, the contents of the message is a CAL message. A routine to process a CAL message is called. The routine is given the location of the buffer containing the message (input [6]—input [6+msg len]), and the length of the message, msg len. The routine to process the CAL message returns the response, its length and the status of processing the message.

If the message was processed successfully (375), an OK byte is transmitted (376) to indicate that the message was processed successfully. If the checksum was in error or an error occurred while processing the message, a NAK2 is returned. If there is a response to return (377), the length of the response is checked to ensure that it is less than or equal to 256 bytes (378). If the response is too long, a NAK2 is returned.

Figure 5F:
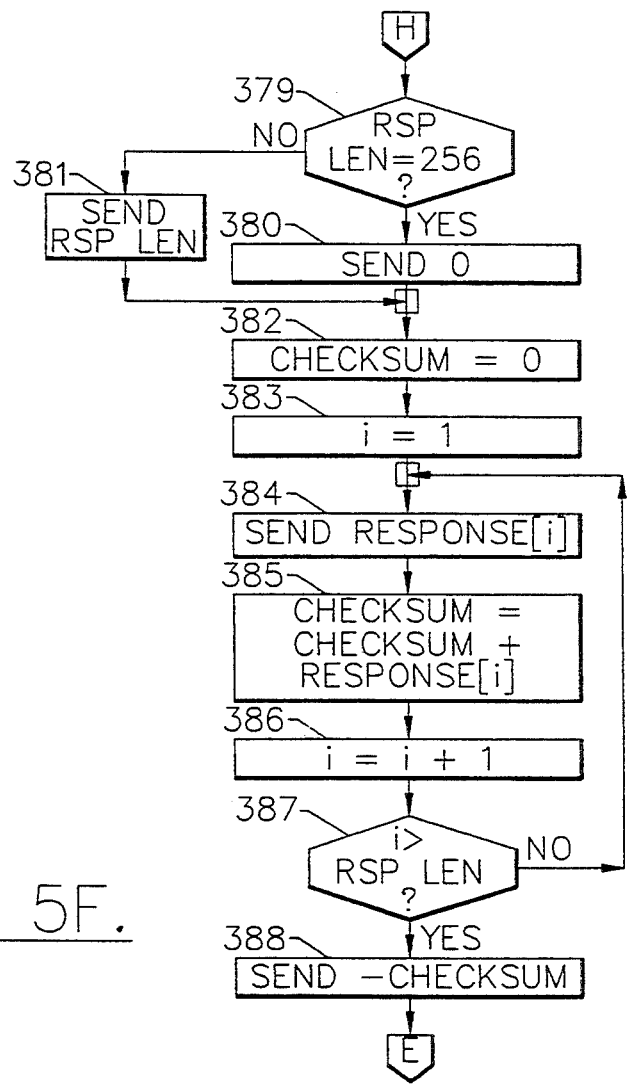

Referring now to FIG. 5F, if the length of the response is exactly 256 bytes (379), zero is transmitted for the length of the response (380). If the response is less than 256 bytes, the actual length of the response is transmitted (381). The checksum is set to zero (382), the index variable is set to 1 (383), and a loop is entered to transmit the response (384-387).

Particularly, the next byte of the response, response [i], is transmitted (384), and the checksum is updated with the value of the byte transmitted (385). The index variable is incremented to the next element in the response (386), and if the last byte of the response has been transmitted (387), the two's complement of the checksum is transmitted (388).

Figure 5G:
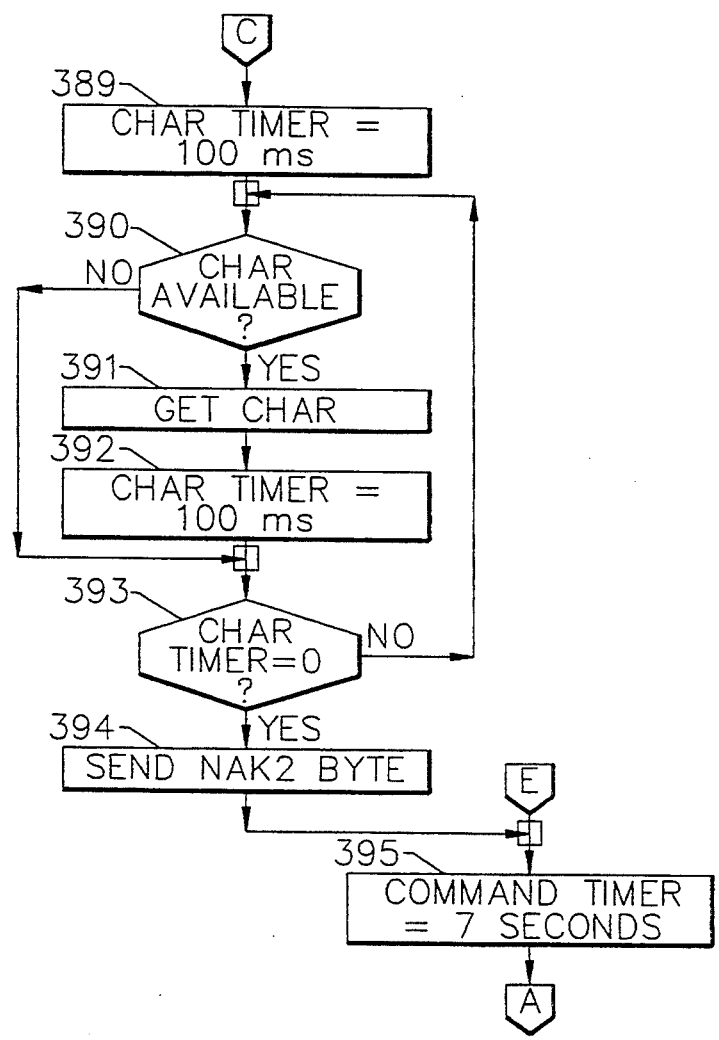

Referring to FIG. 5G, if an error occurred at some point in either receiving the command or message or in processing the message, a loop (390-393) is entered to discard any further input from the reader device. The inter-character timer is set to 100 ms (389). If a character is available (390), the character is read from the SCI (391) and the inter-character timer is set to 100 ms (392). When a character is not received for 100 ms (393), a NAK2 byte is sent to the reader to indicate an error occurred (394). If data was received from the reader, whether or not it was a valid command, the inter command timer is set to seven second (395) and the communication unit begins looking for another command to process.

The foregoing describes, in detail, an algorithm for writing a command to the communications unit, meter register, effecting the execution of the command, and reading the results of the execution. The write, indirect execute, and read operations are all driven from one command provided from the reading device to the communication unit.

Although the present invention has been described in an CAL context, the present invention has utility in other contexts. In addition, the communications media utilized to couple the communications unit to an external reading device (e.g., handheld reader, computer) may be any media such as radio, optical, fiber optic, etc.

While the present invention has been described with respect to specific embodiments, many modifications, variations, substitutions, and equivalents will be apparent to those skilled in the art. Accordingly, the invention is to be considered as limited only by the spirit and scope of the appended claims.

What is claimed is:

1. An electrical metering device comprising:
   metering means for measuring energy consumption of an electrical load associated with the electrical metering device;
   register means, operatively connected to said metering means, for tabulating load profile data related to the measured energy consumption of the associated electrical load; and
   communications means for bidirectionally communicating between said register means and an external communications device, said communications means comprising:
   a plurality of buffers, each having a predetermined address, for storing data therein;
   address free invoke signal receiving means for receiving an invoke signal requesting the electrical metering device to perform a predetermined function wherein the predetermined function requires data stored in at least one of said plurality of buffers and wherein the invoke signal does not include an address of the buffers in which the required data is stored; and
   address independent accessing means, responsive to said address free invoke signal receiving means, for accessing the data stored in at least one of the buffers which is required to perform the predetermined function such that the external communications device can request the electrical metering device to perform a predetermined function requiring data stored in at least one of said buffers without providing an address of the required buffer.

2. An electrical metering device according to claim 1 wherein the data stored in at least one of said plurality of buffers includes the load profile data tabulated by said register means, and wherein said plurality of buffers comprises a random access memory device.

3. An electrical metering device according to claim 1 wherein said register means comprises power failure sensing means for transmitting a warning signal indicative of an impending loss of power to said communications means such that data can be saved in said plurality of buffers prior to the loss of power.

4. An electrical metering device according to claim 1 wherein said address free invoke signal receiving means comprises an optical port, and wherein the external communications device is an optical reader adapted for communicating with said optical port.

5. An electrical metering device according to claim 1 wherein said address independent accessing means comprises a serial communications interface for communicating with said register means.

6. An electrical metering device according to claim 1 wherein said address independent accessing means comprises means for transmitting signals generated in response to the received invoke signal.

7. An electrical metering device comprising:
   metering means for measuring energy consumption of an electrical load associated with the electrical metering device;
   register means, operatively connected to said metering means, for tabulating load profile data related to the measured energy consumption of the associated electrical load;
   a plurality of buffers, each having a predetermined address, for storing data therein;
   address free invoke signal receiving means for receiving an invoke signal from an external communications device requesting the electrical metering device to perform a predetermined function wherein the predetermined function requires data stored in at least one of said plurality of buffers and wherein the invoke signal does not include an address of the buffers in which the required data is stored and for transmitting output signals to the external communications device; and
   address independent accessing means, responsive to said address free invoke signal receiving means, for accessing the data stored in at least one of the buffers which is required to perform the predetermined function such that the external communications device can request the electrical metering device to perform a predetermined function requiring data stored in at least one of said buffers without providing an address of the required buffer.

8. An electrical metering device according to claim 7 wherein the data stored in at least one of said plurality of buffers includes the load profile data tabulated by said register means, and wherein said plurality of buffers comprises a random access memory device.

9. An electrical metering device according to claim 7 wherein said register means comprises power failure sensing means for transmitting a warning signal indicative of an impending loss of power to said address independent accessing means such that data can be saved in said plurality of buffers prior to the loss of power.

10. An electrical metering device according to claim 7 wherein said address free invoke signal receiving means comprises an optical port, and wherein the external communications device is an optical reader adapted for communicating with said optical port.

11. An electrical metering device according to claim 7 wherein said address independent accessing means comprises a serial communications interface for communicating with said register means.

12. A method of performing a predetermined function with an electrical metering device having data stored in a plurality of memory locations, each memory location having a predetermined address, the method comprising the steps of:
   receiving an address free invoke signal from an external communications device requesting the electrical metering device to perform a predetermined function requiring data stored in at least one of the predetermined memory locations wherein the invoke signal does not include the address of the memory location in which the required data is stored;
   accessing the required data stored in at least one of the memory locations to perform the predetermined function requested by the address free invoke signal; and
   generating a response to the received address free invoke signal based on the accessed data such that the electrical metering device performs the predetermined function requiring data stored in at least one of the predetermined memory locations without receiving the address of the required memory location from the external communications device.

13. A method according to claim 12 further comprising the steps of:
   measuring the energy consumption of electrical load associated with the electrical metering device; and
   tabulating load profile data related to the measured energy consumption of the associated electrical load.

14. A method according to claim 13 further comprising the step of storing the tabulated load profile data in at least one of the predetermined memory locations.

15. A method according to claim 12 wherein said step of generating a response to the received address free invoke signal includes the step of transmitting signals based on the accessed data.

16. A method according to claim 12 wherein the external communications device comprises an optical reader, and wherein said step of receiving an address free invoke signal comprises the step of optically communicating with the optical reader.

17. A method according to claim 12 further comprising the steps of:
   producing a warning signal indicative of an impending loss of power; and
   saving data, in response to the warning signal, in the predetermined memory locations prior to the loss of power.

* * * * *